United States Patent [19]

Ueda et al.

[11] Patent Number: 5,285,155

[45] Date of Patent: Feb. 8, 1994

[54] METHOD AND APPARATUS FOR MAGNETIC FLUX LOCKING BASED UPON A HISTORY OF PLURAL COMPARISONS OF THE SQUID OUTPUT SIGNAL AND A PREDETERMINED SIGNAL

[75] Inventors: Tomoaki Ueda, Kyoto; Yasuto Yanagida; Masahiro Tanaka, both of Shiga, all of Japan

[73] Assignee: Daikin Industries, Ltd., Japan

[21] Appl. No.: 766,101

[22] Filed: Sep. 27, 1991

[30] Foreign Application Priority Data

Sep. 30, 1990 [JP] Japan .................... 2-262018

[51] Int. Cl.$^5$ .................... G01R 33/02; G01R 33/035
[52] U.S. Cl. ...................... 324/248; 505/846
[58] Field of Search ................ 324/248; 505/846

[56] References Cited

U.S. PATENT DOCUMENTS 3,532,971 10/1970 Anderson et al.
4,672,359 6/1987 Silver .................... 324/248

OTHER PUBLICATIONS

H. Matz et al, "High Slew Rate Gradiometer Prototype with Digital Feedback Loop of Variable Step Size", *Cryogenics*, vol. 30, No. Guildford GB, pp. 330–334 (Apr. 1990).

M. C. Buncick et al, "Computer–Controlled Method for Removal of Stray Fields", *Review of Scientific Instruments*, vol. 54, No. 1, New York, U.S., pp. 100–103 (Jan. 1983).

D. Drung, "Digital Feedback Loops for D.C. SQUIDs", *Cryogenics*, vol. 26, No. 11, Guilford, GB, pp. 623–627 (Nov. 1986).

A. I. Abu-El-Haila et al, "Improving Performance of Digital Sinusoidal Oscillators by Means of Error Feedback Circuits", *IEEE Transactions on Circuits and Systems*, vol. 33, No. 4, New York, U.S. (Apr. 1986).

*Primary Examiner*—Walter E. Snow
*Attorney, Agent, or Firm*—Beveridge, DeGrandi, Weilacher & Young

[57] ABSTRACT

Output currents from a superconducting quantum interference device which corresponds to magnetic flux guided thereto are compared with a predetermined value which corresponds to a magnetic flux locking point so as to detect a direction of shift with respect to the magnetic flux locking point. A shift quantity is judged to determine whether or not it is large based upon a history of the shift direction. A variation value component of an estimate feedback quantity is varied by taking this history into consideration. The estimate feedback quantity is used to guide magnetic flux for compensating for variation in the magnetic flux which is guided to the superconducting quantum interference device.

4 Claims, 12 Drawing Sheets

METHOD AND APPARATUS FOR MAGNETIC FLUX LOCKING BASED UPON A HISTORY OF PLURAL COMPARISONS OF THE SQUID OUTPUT SIGNAL AND A PREDETERMINED SIGNAL

BACKGROUND OF THE INVENTION

The present invention relates to magnetic flux locking methods and apparatus. More particularly, the present invention relates to methods and apparatus for supplying a feedback signal to a feedback coil so as to compensate for variations in the magnetic flux which is guided to a superconductive loop of a superconducting quantum interference device (hereinafter referred to as a SQUID) by an input coil when the SQUID is operated and housed in a casing which is cooled by a refrigerator to a temperature below the critical temperature for superconductivity.

It is known that a SQUID is capable of detecting magnetic flux with extremely high sensitivity. With attention to this characteristic, a SQUID is applied to various apparatus which are used in various technical fields. A SQUID is classified as an rf-SQUID if it has only one Josephson junction (hereinafter referred to as a JJ) and as a dc-SQUID if it has two JJs. The rf-SQUID was generally used in the past years, while the dc-SQUID is being widely used in recent years because two JJs having similar characteristics can be obtained due to improvements in thin film manufacturing engineering in recent years.

FIG. 12 is an electric diagram for explaining the principle of a dc-SQUID flux meter.

The dc-SQUID includes a superconductive loop 71 and two JJs 72 which are provided at predetermined positions on the superconductive loop 71. A bias current is supplied to the opposite positions on the superconductive loop 71 with respect to the JJs 72 by a constant current source 70. An input coil 73, which is interconnected with a pickup coil 74 for detecting the magnetic flux of an object under measurement, is provided at a closed position on the superconductive loop 71. A voltage is output from the opposite positions on the superconductive loop 71 with respect to the JJs 72, the output voltage is transformed by a voltage transformation transformer 75 and then is amplified by an amplifier 76. The amplified voltage is demodulated by a synchronous detector 78 based on the modulated signal output from an oscillator 77, then the demodulated signal is integrated by an integrator 79 so as to output a voltage which is proportional to the exterior magnetic flux. Further, the output signal output from the integrator 79 and the modulated signal output from the oscillator 77 are added by an adder 80. The added signal is converted into a feedback current by a voltage-current converter 81, and the feedback current is supplied to a feedback coil 82 so as to eliminate the exterior magnetic flux detected by the pickup coil 74.

When the dc-SQUID is integrated into a magnetic flux locked loop (hereinafter referred to as a FLL) having the arrangement shown in FIG. 12, the interlinkage magnetic flux of the superconductive loop 71 can be measured by maintaining the magnetic flux at a point having the highest transformation rate of magnetic flux to voltage, because the FLL distinguishes the disadvantage that the interlinkage magnetic flux cannot be measured as it is due to the cyclic alteration of the transformation coefficient of the magnetic flux to the voltage based on the size of the interlinkage magnetic flux (refer to FIG. 6). More particularly, the magnetic flux which has the same size, and polarity which is the reverse of the externally supplied magnetic flux to the superconductive loop 71 through the pickup coil 74 and input coil 73, is fed back by the feedback coil 82 so as to cancel the external magnetic flux. The external magnetic flux can be measured by monitoring the feedback current supplied to the feedback coil 82.

When the FLL having the arrangement above-mentioned is employed, disadvantages arise in that the circuitry scale is enlarged, expensive electrical devices are needed in use, demands for minimizing, and multichannel application are greatly difficult to achieve. Further disadvantages arise in that operability is incorrect and working efficiency is reduced because adjusting operations such as gain adjustment, phase adjustment and the like are needed and the adjusting operations need a fairly long time. Especially, when SQUIDs and FLLs are provided for multichannel application, a disadvantage arises in that multichannel application which is actually achievable is suppressed because the time necessary for adjustment operations is lengthened in proportion to the number of channels. Furthermore, when SQUIDs and FLLs are applied to magnetic flux measurement for living organisms, a computer must receive measured magnetic flux for multichannel performed processings such as estimating a position singled out for an operation and the like. The computer must receive analog values output from corresponding FLLs in a parallel multichannel arrangement for a long time with high speed. The quantity of data which are processed by the computer accordingly becomes extremely great and expensive analog to digital converters (hereinafter referred to as A/D converters) which have high resolution are accordingly employed, thereby a great load is applied to the computer. As a result, disadvantages arise in that multichannel application which is actually achievable is suppressed and a measurement system including SQUIDs and FLLs is expensive.

SUMMARY OF THE INVENTION

It is an object of the present invention to deal with multichannel application easily.

It is another object of the present invention to extremely decrease the quantity of data output from a FLL.

To perform the objects above-mentioned, a magnetic flux locking method according to the present invention comprises the steps of;

judging relationship in the size of an output signal output from opposite ends of a superconductive loop of a SQUID and a predetermined signal to obtain a judgement result, the SQUID being supplied with a predetermined bias and the predetermined signal corresponding to a point in a monotonously varying portion of a magnetic flux-voltage conversion coefficient function of a SQUID, holding judgement results in a time sequential manner to obtain a history of judgement results.

varying a variation value component of a feedback signal by taking the history of the judgement results into consideration, and supplying a feedback signal to a feedback coil of the SQUID, the value of the feedback signal being determined based on the latest judgement result and the varied variation value component.

When this magnetic flux locking method is employed, the SQUID is housed in a casing that is refrigerated to a temperature below the critical temperature for superconductivity. The feedback coil of the SQUID is supplied the feedback signal for compensating for variations in the quantity of magnetic flux guided by the input coil to the superconductive loop of the SQUID. Thereby, the magnetic flux guided to the superconductive loop of the SQUID is maintained constant. To perform the magnetic flux locking operation above-mentioned, the output signal output from the opposite ends of the superconductive loop of the SQUID is compared in size or magnitude relative to the signal corresponding to the point in a monotonously varying portion of the magnetic flux-voltage conversion coefficient function of the SQUID so as to obtain a judgement result. The judgement result is held in a time sequence manner, thereby the quantity of data which are output and collected from the FLL is greatly decreased. As a result, multichannel application is easily dealt with. Also, the variation value component of the feedback signal is varied by taking the history of the judgement results into consideration, then the feedback signal which is determined based on the latest judgement result and the variation value component is supplied to the feedback coil for compensating the magnetic flux guided to the superconductive loop of the SQUID. Therefore, the variation value component of the feedback signal is enlarged when the magnet flux guided to the superconductive loop of the SQUID greatly differs from the point for locking the magnetic flux, while the variation value of the feedback signal is lessened when the magnet flux guided to the superconductive loop of the SQUID slightly differs from the point for locking the magnetic flux. Thereby, magnetic flux measurement is performed at high speed and with high accuracy. As is apparent from the foregoing, the FLL is easily digitalized and an automated adjustment of the FLL, for noise reduction and the like are easily performed due to the digitalization of the FLL. The original data is easily restored by applying a method similar to magnetic flux locking when the digitalized and compressed data are recorded. Furthermore, when a signal corresponding to a point in a monotonously varying portion of the magnetic flux-voltage conversion coefficient function of the SQUID is varied, output voltages corresponding to each timing of output from the SQUID are detected. Thereby, characteristics of the SQUID are measured.

It is preferable that the variation value component is incremented when the same kind of judgement results continue, while the variation value is decremented when different kinds of judgement results are alternately obtained.

When this method is employed, a condition in which operation with high speed must be obtained by increasing the variation value and a condition in which operation with high accuracy must be obtained by decreasing the variation value are easily recognized and are easily dealt with.

To perform the objects above-mentioned, a magnetic flux locking apparatus according to the present invention comprises;

judging means for judging the relationship in size of an output signal output from opposite ends of a superconductive loop of a SQUID and a predetermined signal to obtain a judgement result, the SQUID being supplied with a predetermined bias and the predetermined signal corresponding to a point in a monotonously varying portion of a magnetic flux-voltage conversion coefficient function of a SQUID, holding means for holding judgement results in a time sequential manner to obtain a history of judgement results, variation value controlling means for varying a variation value component of a feedback signal by taking the history of judgement signal into consideration, and polarity controlling mean for controlling the polarity of the variation value component of the feedback signal based on the judgement result.

When this apparatus is employed, the SQUID is housed in a casing that is refrigerated to a temperature below the critical temperature for superconductivity. The feedback coil of the SQUID is supplied the feedback signal for compensating for variations in the quantity of magnetic flux guided by the input coil to the superconductive loop of the SQUID. Thereby, the magnetic flux guided to the superconductive loop of the SQUID is maintained constant. To perform the magnetic flux locking operation above-mentioned, the output signal output from the opposite ends of the superconductive loop of the SQUID is compared in size by the judging means with the signal which corresponds to the point in a monotonously varying portion of the magnetic flux-voltage conversion coefficient function of the SQUID so as to obtain a judgement result. The judgement result is held by the holding means in a time sequence manner. Thereafter, the variation value component of the feedback signal is varied by the variation value controlling means by taking the history of the judgement results into consideration, then the polarity of the variation value component of the feedback signal is controlled by the polarity controlling means based on the judgement result. The feedback signal corresponding to a shift quantity of a magnetic flux from the magnetic flux which is used for locking the magnetic flux, is accordingly supplied to the feedback coil.

As is apparent from the foregoing, the output and collected signals consists of the judgement result data quantities, thereby multichannel application is easily dealt with. Further, the variation value component of the feedback signal is enlarged when the magnetic flux guided to the superconductive loop of the SQUID greatly differs from the point for locking the magnetic flux, while the variation value of the feedback signal is lessened when the magnetic flux guided to the superconductive loop of the SQUID slightly differs from the point for locking the magnetic flux. Thereby, magnetic flux measurement is performed at high speed and with high accuracy.

It is preferable that the variation value controlling means increments the variation value component when the same kind of judgement results continue, and decrements the variation value component when different kinds of judgement results are alternately obtained.

When this apparatus is employed, an arrangement can be simplified for recognizing a condition in which operation with high speed must be obtained by increasing the variation value and a condition in which operation with high accuracy must be obtained by decreasing the variation value, thereby the arrangement of the variation value controlling means can be simplified.

To perform the objects above-mentioned, another magnetic flux locking method according to the present invention comprises the steps of;

collecting output signals in synchronism with magnetic flux modulation, the output signals being output from opposite ends of a superconductive loop of a SQUID to which is supplied a predetermined bias, alternately holding the output signals, judging the relationship in size of alternately held output signals to obtain a judgement result, holding judgement results in a time sequential manner to obtain a history of judgement results, varying a variation value component of an estimated feedback quantity by taking the history of judgement results into consideration, and supplying the feedback signal to a feedback coil of the SQUID, the feedback signal having a value determined by varying the estimate feedback quantity based on the latest judgement result.

When this magnetic flux locking method is employed, the SQUID is housed in a casing that is refrigerated to a temperature below the critical temperature for superconductivity. The feedback coil of the SQUID is supplied the feedback signal, which is obtained by magnetically modulating an estimate feedback quantity, for compensating for variations in the quantity of magnetic flux guided by the input coil to the superconductive loop of the SQUID. Thereby, the magnetic flux guided to the superconductive loop of the SQUID is maintained constant. To perform the magnetic flux locking operation above-mentioned, the output signals output from the opposite ends of the superconductive loop of the SQUID are collected and held alternately. The alternately held output signals are compared in size with one another so as to obtain a judgement result. The judgement result is held in a time sequential manner. Thereby, the quantity of data which is output and collected from the FLL is greatly decreased. As a result, multichannel application is easily dealt with. Also, the variation value component of the feedback signal is varied by taking the history of the judgement results into consideration, then the feedback signal which is determined by varying the estimate feedback quantity based on the latest judgement result, is supplied to the feedback coil for compensating the magnetic flux guided to the superconductive loop of the SQUID. Therefore, the variation value component of the feedback signal is enlarged when the magnetic flux guided to the superconductive loop of the SQUID greatly differs from the point for locking the magnetic flux, while the variation value component of the feedback signal is lessened when the magnetic flux guided to the superconductive loop of the SQUID slightly differs from the point for locking the magnetic flux. Thereby, magnetic flux measurement is performed at high speed and with high accuracy. As is apparent from the foregoing, magnetic flux locking is achieved with high accuracy and is prevented from being influenced by voltage drift.

To perform the objects above-mentioned, another magnetic flux locking apparatus according to the present invention comprises;

collection means for collecting output signals in synchronism with magnetic flux modulation, the output signals being output from opposite ends of a superconductive loop of a SQUID to which is supplied a predetermined bias, a pair of signal holding means for alternately holding the output signals, judging means for judging the relationship in size of output signals held by the signal holding means to obtain a judgement result, judgement result holding means for holding judgement results in a time sequential manner to obtain a history of judgement results, variation value controlling means for varying a variation value component of an estimate feedback quantity by taking the history of judgement signals into consideration, and polarity controlling means for controlling the polarity of the variation value component of the estimate feedback quantity based on the judgement result.

When this magnetic flux locking method is employed, the SQUID is housed in a casing that is refrigerated to a temperature below the critical temperature for superconductivity. The feedback coil of the SQUID is supplied the feedback signal, which is obtained by magnetically modulating an estimate feedback quantity, for compensating for variations in the quantity of magnetic flux guided by the input coil to the superconductive loop of the SQUID. Thereby, the magnetic flux guided to the superconductive loop of the SQUID is maintained constant. To perform the magnetic flux locking operation above-mentioned, the output signals output from the opposite ends of the superconductive loop of the SQUID are collected by the collection means and held alternately by a pair of signal holding means. The output signals held by the signal holding means are compared in size with one another by the judging means so as to obtain a judgement result. The judgement result is held by the judgement holding means in a time sequential manner. The variation value component of the estimate feedback quantity is varied by the variation value controlling means based on the history of the judgement results, and the polarity of the variation value component of the estimate feedback quantity is controlled by the polarity controlling means based on the judgement result. Thereby, the feedback signal which is obtained by applying magnetic flux modulation to the estimate feedback quantity corresponding to the shift quantity with respect to the point for locking magnetic flux, can be supplied to the feedback coil. Therefore, signals output and collected from the FLL consist of judgement results which have an extremely lesser quantity of data. As a result, multichannel application is easily dealt with. Also, the variation value component of the estimate feedback quantity is enlarged when the magnetic flux guided to the superconductive loop of the SQUID greatly differs from the point for locking the magnetic flux, while the variation value of the estimate feedback quantity is lessened when the magnet flux guided to the superconductive loop of the SQUID slightly differs from the point for locking the magnetic flux. Thereby, magnetic flux measurement is performed at high speed and with high accuracy. As is apparent from the foregoing, magnetic flux locking is achieved with high accuracy and is prevented from being influenced by voltage drift.

These and other objectives, features and advantages of the present invention will be more readily understood upon consideration of the present invention, in conjunction with the accompanying drawings.

DETAILED DESCRIPTION OF THE PREFERRED EMBODIMENTS

Figure 4:
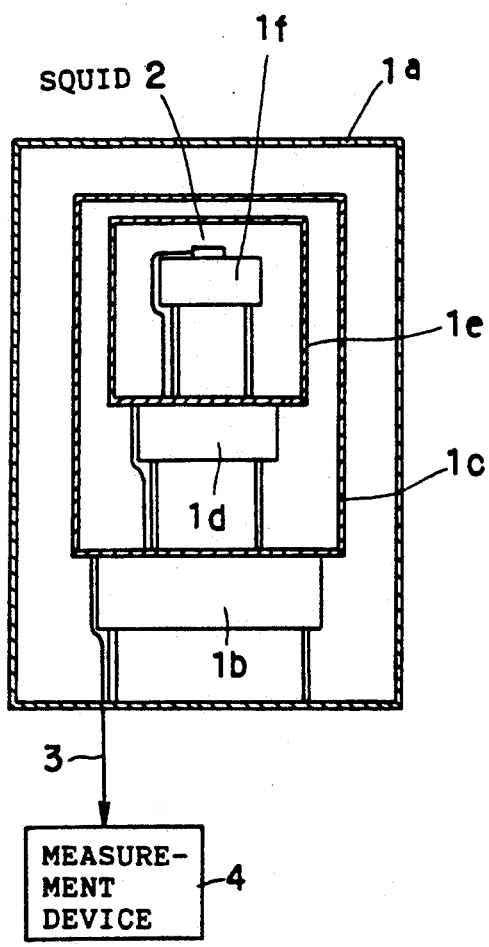
FIG. 4 is a schematic cross-sectional view of a refrigeration casing in which is applied a magnetic flux measurement apparatus using SQUIDs.

FIG. 4 is a schematical cross sectional view of a refrigeration casing in which is applied a magnetic flux measurement apparatus using SQUIDs.

The refrigeration casing comprises;

a vacuum casing 1a, a refrigerator 1b for refrigerating to 300 K (300 Kelvin) which is provided in the vacuum casing 1a, a shield 1c for radiant heat which is supported on the refregerator 1b, a refrigerator 1d for refrigerating to 70 K which is provided in a space surrounded by the shield 1c, a shield 1e for radiant heat which is supported on the refrigerator 1d, a refrigerator 1f for refrigerating to 4.2 K which is provided in a space surrounded by the shield 1e, plural SQUIDs 2 which are interconnected in parallel and are supported by the refrigerator 1f, and electrical lines 3 for interconnecting the SQUIDs 2 and a measurement device 4 which is provided at the exterior of the vacuum casing 1a.

Figure 3:
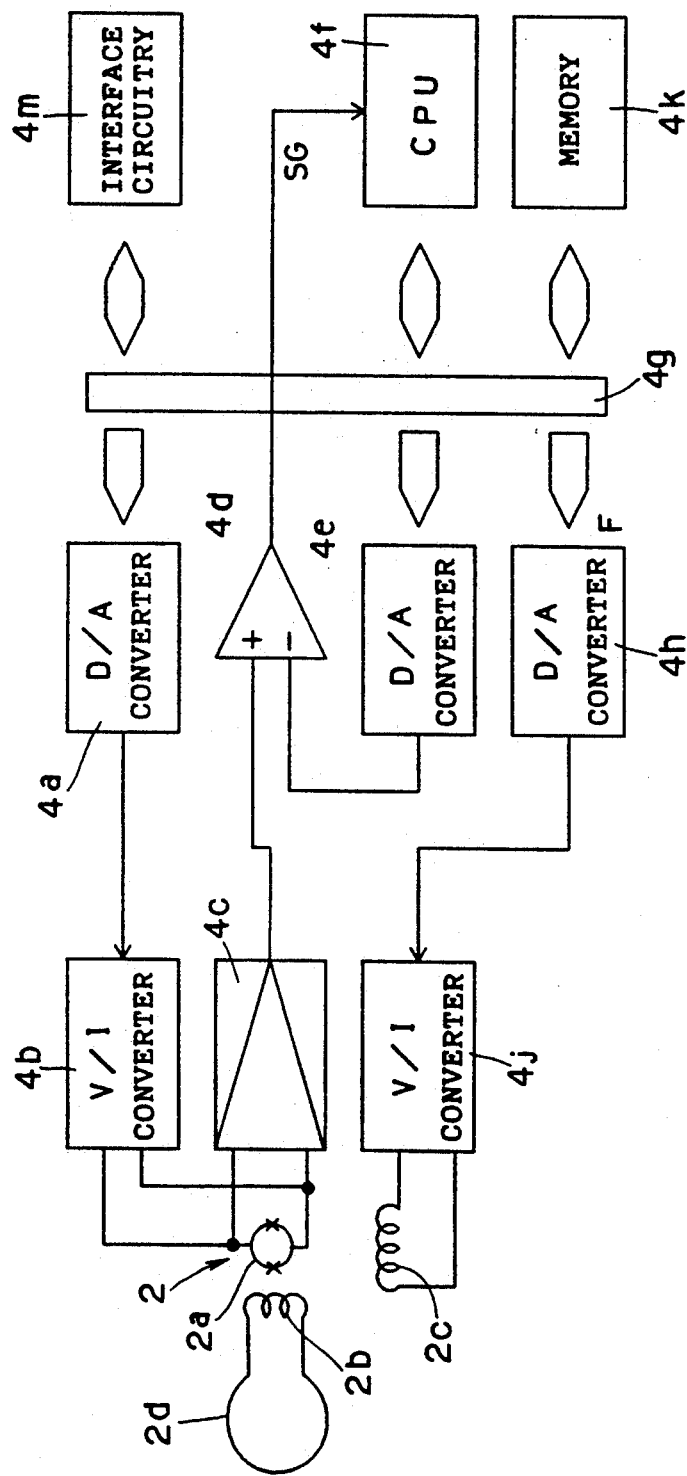
FIG. 3 is an electrical diagram showing a magnetic flux locking apparatus to which is applied the magnetic flux locking method according to the present invention.

FIG. 3 is an electrical diagram showing a magnetic flux locking apparatus to which is applied the magnetic flux looking method (described later) according to the present invention.

A superconductive loop 2a of a SQUID 2 is supplied with a bias current by a digital to analog converter (herein after referred to as D/A converter) 4a and a voltage to current converter (hereinafter referred to as V/I converter) 4b, the D/A converter 4a and the V/I converter 4b operate as a bias current source. A voltage between the opposite ends of the superconductive loop 2a is amplified by a pre-amplifier 4c, then the amplified voltage is applied to one input terminal of a comparator 4d. To the other input terminal of the comparator 4d is applied a standard voltage by a D/A converter 4e, which standard voltage corresponds to a voltage at a point in a monotonously varying portion of a magnetic flux-voltage conversion coefficient function of the SQUID. An output signal from the comparator 4d is supplied to a central processing unit (hereinafter referred to as CPU) 4f as a judgement result SG. The CPU 4f supplies predetermined digital signals to the D/A converters 4a and 4e through a data bus 4g, and supplies an estimate feedback quantity F for magnetic flux looking to a D/A converter 4h for feedback. An analog signal output from the D/A converter 4h is converted by a V/I converter 4j to a feedback current, then the feedback current is supplied to a feedback coil 2c of the SQUID 2. The apparatus further includes a memory 4k and interface circuitry 4m. External magnetic flux is detected by a pickup coil 2d and is efficiently guided to the superconductive loop 2a of the SQUID 2 by an input coil 2b.

Figure 1:
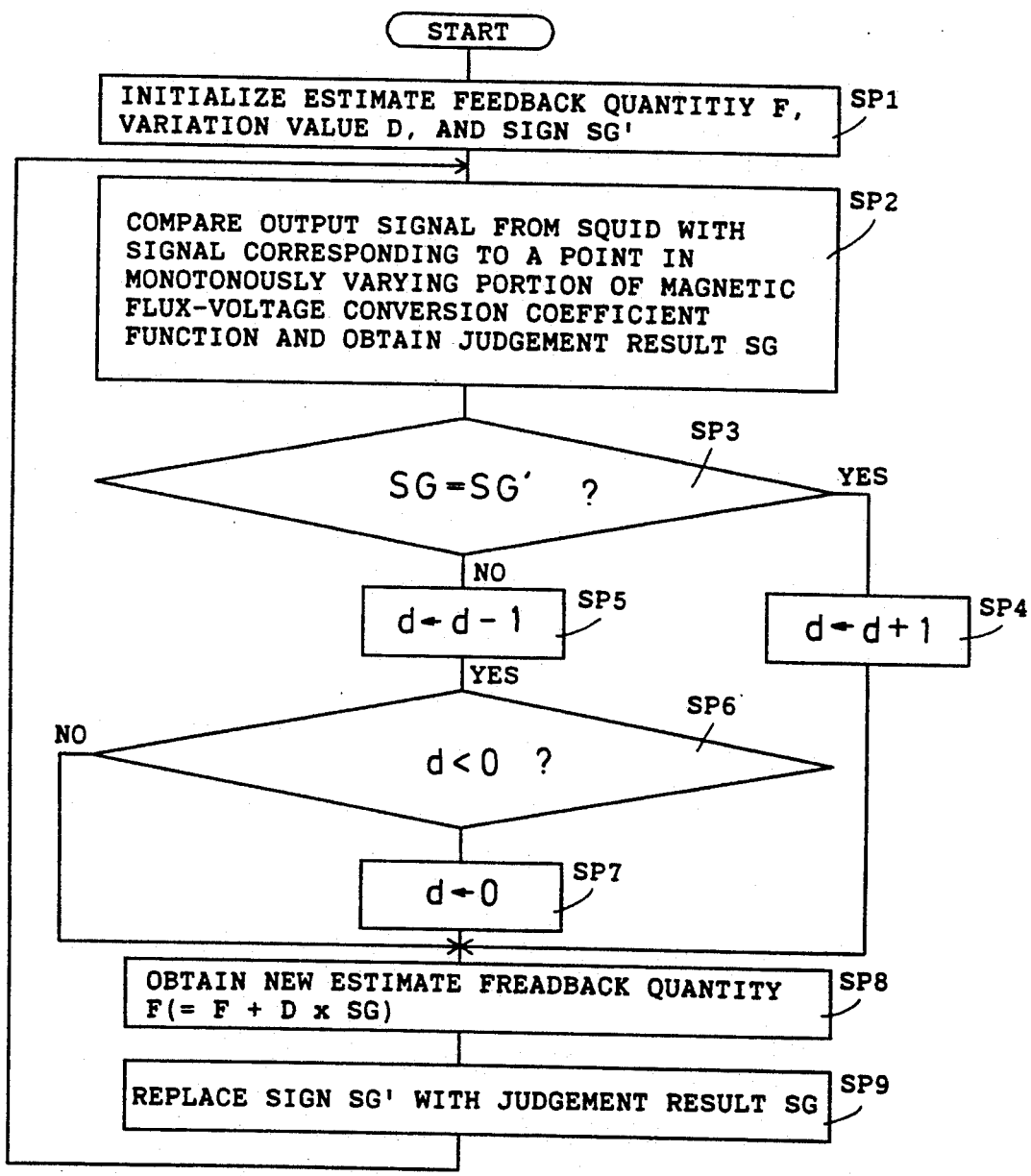
FIG. 1 is a flowchart illustrating an embodiment of a magnetic flux locking method according to the present invention.

FIG. 1 is a flowchart illustrating an embodiment of a magnetic flux locking method according to the present invention.

In step SP1, an estimate feedback quantity F, a variation value component d of the estimate feedback quantity F and a sign SG' of the variation value component d are initialized. Specifically, F is determined to be an initial value, while d and SG' are determined to be "1", for example. In step SP2, a signal output and collected from the opposite ends of the superconductive loop 2a of the SQUID 2 is compared in size with a signal corresponding to a point in a monotonously varying portion of a magnet flux-voltage conversion coefficient function of the SQUID 2 so as to obtain a judgement result SG. Specifically, SG is determined to be "−1" when the former signal is greater, while SG is determined to be "1" when the former signal is not greater. In step SP3, it is judged whether or not the judgement result SG equals the sign SG'. When it is judged in step SP3 that the judgement result SG equals the sign SG', in step SP4, the variation value d is incremented by "1". On the contrary, when it is judged in step SP3 that the judgement result SG does not equal to the sign SG', in step SP5, the variation value d is decremented by "1". Then, in step SP6, it is judged whether or not the variation value d is less than "0". When it is judged in step SP6 that the variation value d is less than "0", in step SP7, the variation value d is determined to be "0". After processing in step SP4 or step SP7 has been performed or when it is judged in step SP6 that the variation value d is not less than "0", in step SP8, the variation value d is added to the prior estimate feedback quantity F by taking the judgement result SG into consideration so as to obtain a new estimate feedback quantity F (=F+d×SG). In step SP9, the sign SG' is replaced with the judgement result SG. Then, the processing in step SP2 is carried out again.

Figure 2:
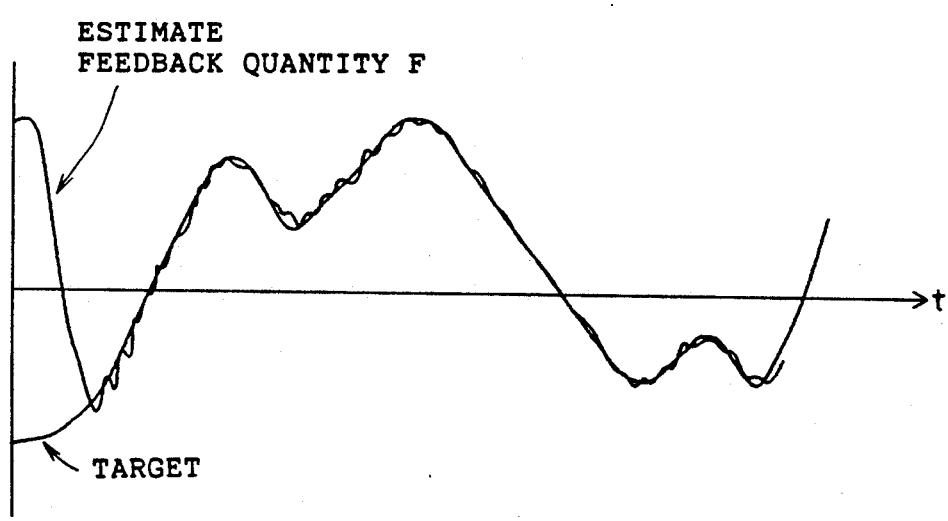
FIG. 2 is a diagram useful in understanding followability and accuracy for magnetic flux locking.

As is apparent from the foregoing and FIG. 2, when the judgement results continue to be the same, the variation value d of the estimate feedback quantity F is increased so as to perform followability to the point for magnetic flux locking at high speed. After the point for magnetic flux locking is followed to some degree, that is, when the judgement results alternately vary, the variation value d of the estimate feedback quantity F is decreased so as to perform followability to the point for magnetic flux locking with high accuracy.

FIRST APPARATUS EMBODIMENT

Figure 5:
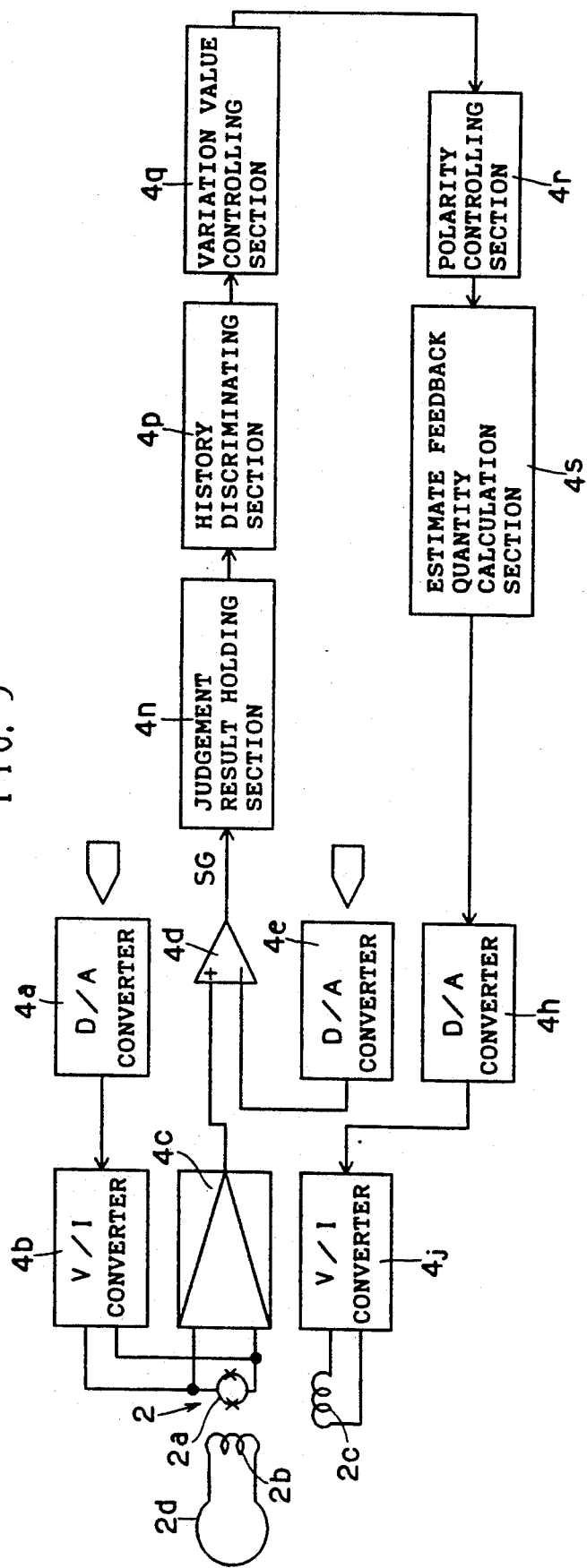
FIG. 5 is an electrical diagram showing an embodiment of a magnetic flux locking apparatus according to the present invention.

FIG. 5 is an electrical diagram showing an embodiment of a magnetic flux locking apparatus according to the present invention.

A superconductive loop 2a of a SQUID 2 is supplied with a bias current by a D/A converter 4a and a V/I converter 4b, the D/A converter 4a and the V/I converter 4b operate as a bias current source. A voltage between the opposite ends of the superconductive loop 2a is amplified by a pre-amplifier 4c, then the amplified voltage is applied to one input terminal of a comparator 4d. To the other input terminal of the comparator 4d is applied a standard voltage by a D/A converter 4e, which standard voltage corresponds to a voltage at a point in a monotonously varying portion of a magnetic flux-voltage conversion coefficient function of the SQUID. A judgement result SG output from the comparator 4d is supplied to a judgement result holding section 4n so as to be held in a time sequential manner. A history discriminating section 4p reads out judgement results SG from the judgement result holding section 4n and discriminates the history of the judgement results. A variation value component controlling section 4q receives a history discrimination result output from the history discriminating section 4p and varies the variation value component d of the estimate feedback quantity F. A polarity controlling section 4r determines a polarity of the variation value component d based on the latest judgement result SG. An estimate feedback quantity calculation section 4s calculates a new estimate feedback quantity F based on the prior estimate feedback quantity, the varied variation value d and the determined polarity, and supplies the new estimate feedback quantity F as a feedback current to the feedback coil 2c through the D/A converter 4h and the V/I converter 4j.

Operation of the magnetic flux locking apparatus having the arrangement above-mentioned is as follows.

Figure 6:
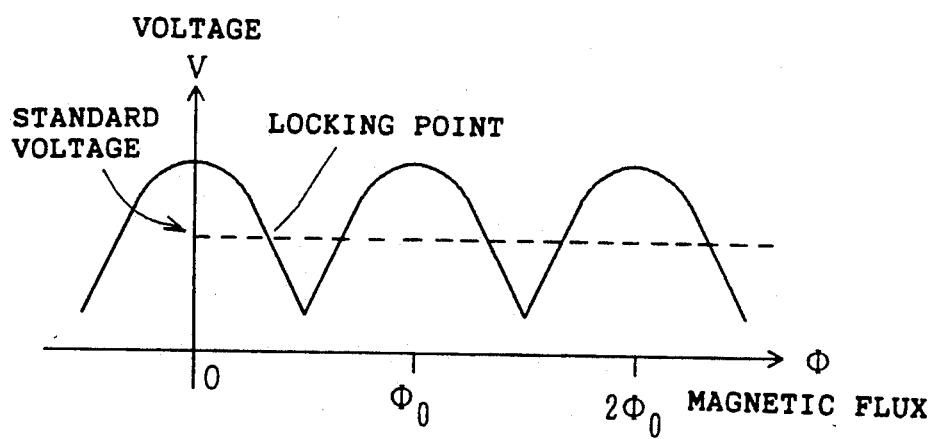
FIG. 6 is a diagram showing a standard voltage value.

The bias current supplied to the superconductive loop 2a by the D/A converter 4a and the V/I converter 4b is determined to be a predetermined value, and the standard voltage supplied to the comparator 4d by the D/A converter 4e is determined to be a value corresponding to a point in a monotonously varying portion of the magnetic flux-voltage conversion coefficient function of the SQUID 2 (refer to FIG. 6), as the initial determination processing.

When magnetic flux which varies is guided to the superconductive loop 2a by the input coil 2b, the voltage between the opposite ends of the superconductive loop 2a varies. The voltage is amplified by the preamplifier 4c and the amplified voltage is compared in magnitude relative to the standard voltage by the comparator 4d so as to obtain a judgement result SG. The obtained judgement result SG is held by the judgement result holding section 4n. When a new judgement result SG is obtained and held by the judgement result holding section 4n, the history discriminating section 4p discriminates the history of the judgement results SG. Specifically, the same kind of judgement results continue when the shift quantity from the point for magnetic flux locking is large, on the contrary, different judgement results SG are alternately obtained when the shift quantity from the point for magnetic flux locking is small. Thereby the history discriminating section 4p discriminates whether the history corresponds to the former class or the latter class. Thereafter, the variation value component d of the estimate feedback quantity F is varied corresponding to the discriminated history by the variation value controlling section 4q, and the polarity of the variation value d is determined by the polarity controlling section 4r based on the latest judgement result SG. A new estimate feedback quantity F (=F+d) is calculated by the estimate feedback quantity calculation section 4s based on the prior estimate feedback quantity F, the varied variation value d and the determined polarity. The estimate feedback quantity F thus calculated is supplied to the feedback coil 2c as the feedback current through the D/A converter 4h and the V/I converter 4j.

As is apparent from the foregoing, a magnetic flux locking operation with high followability to the point for magnetic locking is performed by incrementing the variation value d when the shift quantity from the point for magnetic flux locking is great and the accuracy in magnetic flux locking is not taken into consideration so much. On the contrary, the magnetic flux locking operation with high accuracy is performed by decrementing the variation value d when the shift quantity from the point for magnetic flux locking is small and the accuracy in magnetic flux locking is taken into consideration so much.

Specifically, it is supposed that the resolution of the estimate feedback quantity F calculated by the estimate feedback quantity calculation section 4s is 16 bits, and a varying cycle of an exterior magnetic field is 100 Hz. When the estimate feedback quantity F is to be varied by 1 bit for maintaining high accuracy, $2^{16} \times 2 \times 100$ steps of operations per second should be carried out in the worst case. The step is not a step in a program list but a step for varying the estimate feedback quantity by a unit value. An operation time is accordingly allowed for about 1/13 microseconds per step, thereby each electronic device, the CPU and the like which can operate at extremely high speed, should be employed. On the contrary, where the variation value of the estimate feedback quantity F is determined to be a large value, a disadvantage is overcome in that each electronic device, the CPU and the like which can operate at extremely high speed, should be employed. A further disadvantage arises in that the accuracy for magnetic flux locking is extremely lowered.

The embodiment improves the followability of magnetic flux locking by incrementing the variation value component d of the estimate feedback quantity F when the shift quantity from the point for magnetic flux locking is great, and improves the accuracy of magnetic flux locking by decrementing the variation value d of the estimate feedback quantity F when the magnetic flux guided to the superconducting loop 2a closes to the point for magnetic flux locking. Thereby, each electronic device, a CPU and the like which can not operate at extremely high speed, can be employed.

Figure 7:
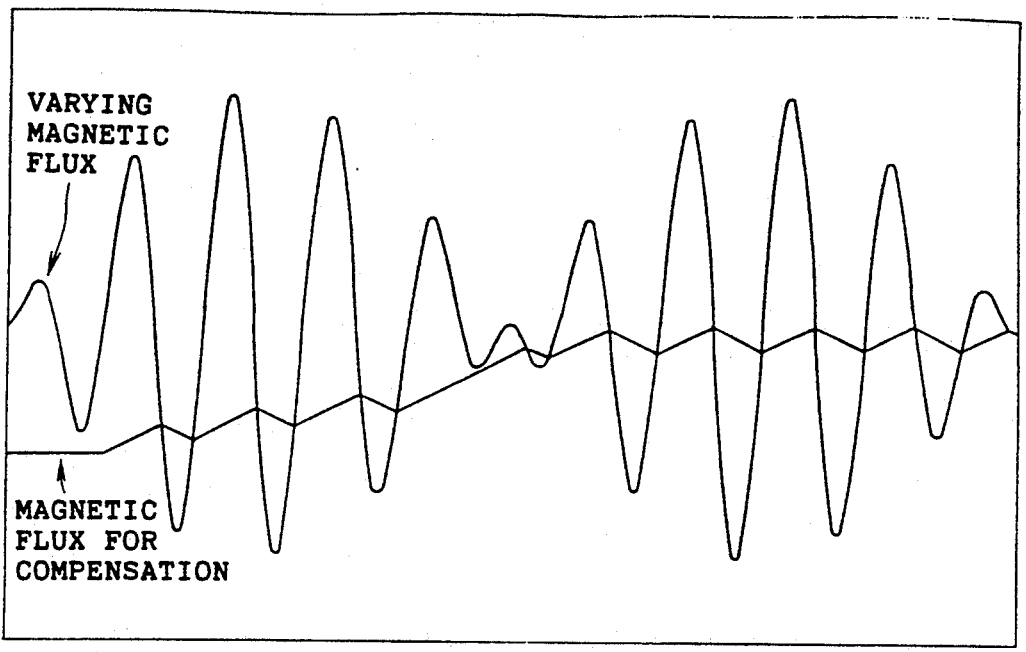
FIG. 7(A) is a diagram showing measurement results for magnetic flux when a variation value d is fixed to "1"
FIG. 7(B) is a diagram showing measurement results for magnetic flux when a variation value d is varied.
Figure 7:
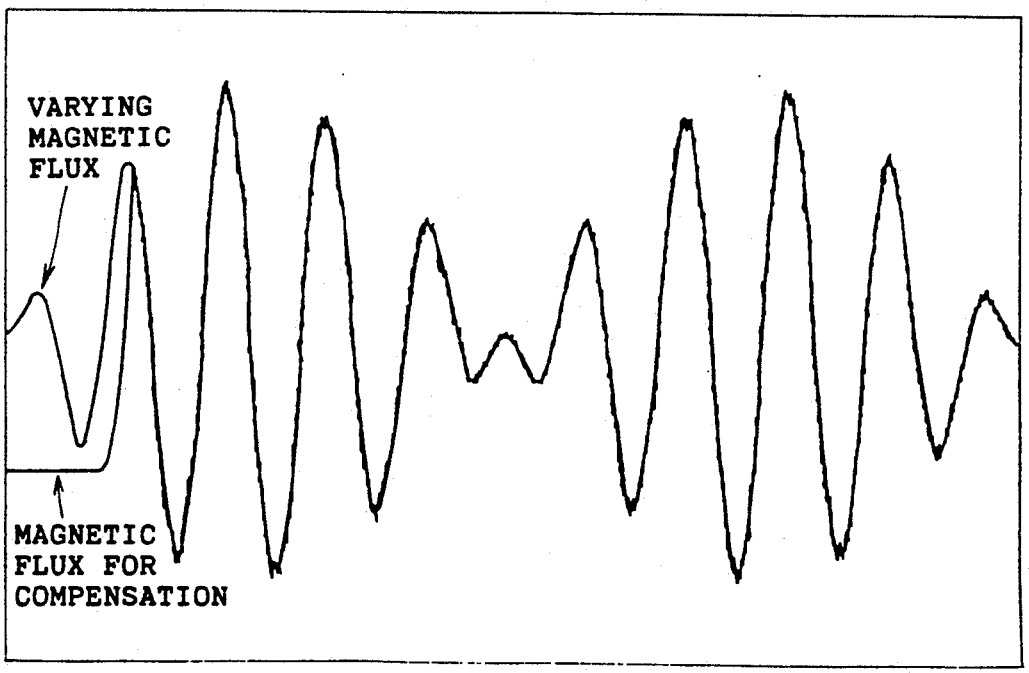

Specifically, when the variation value d of the estimate feedback quantity F is determined and fixed to "1", the magnetic flux looking operation cannot follow to a varying magnetic flux at all as is illustrated in FIG. 7(A). On the contrary, the embodiment performs a fairly high followability to a varying magnetic flux and performs magnetic flux measurement with a fairly high accuracy as is illustrated in FIG. 7(B).

SECOND METHOD EMBODIMENT

Figure 9:
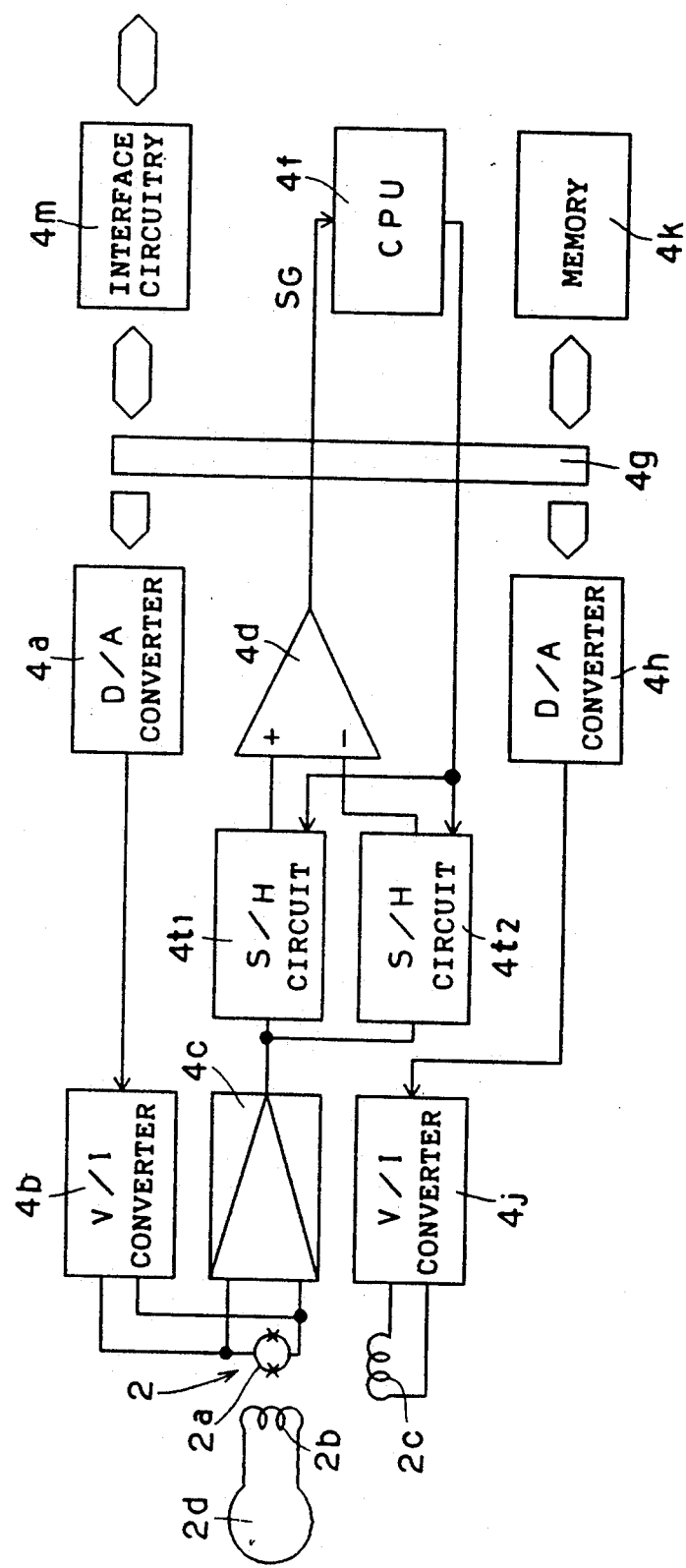
FIG. 9 is an electrical diagram showing a magnetic flux locking apparatus to which is applied the magnetic flux locking method according to the present invention.

FIG. 9 is an electrical diagram showing a magnetic flux locking apparatus to which is applied another magnetic flux locking method (described later) according to the present invention.

This magnetic flux locking apparatus differs from the magnetic flux locking apparatus shown in FIG. 3 in the following points.

A pair of sample and hold circuits (hereinafter referred to as S/H circuits) $4t1$ and $4t2$ for alternately holding output voltages from the pre-amplifier $4c$, are further provided, output voltages held by corresponding S/H circuits $4t1$ and $4t2$ are supplied to corresponding input terminals of the comparator $4d$, the CPU $4f$ supplies a digital signal to the D/A converter $4h$ so as to output a value as the feedback signal, the value being obtained by adding or reducing a variation value $\Delta m$ of magnetic flux modulation from the estimate feedback quantity F, and the CPU $4f$ supplies a control signal to both S/H circuits $4t1$ and $4t2$, the control signal instructing the S/H circuits to operate selectively in synchronism with the magnetic flux modulation.

Figure 8:
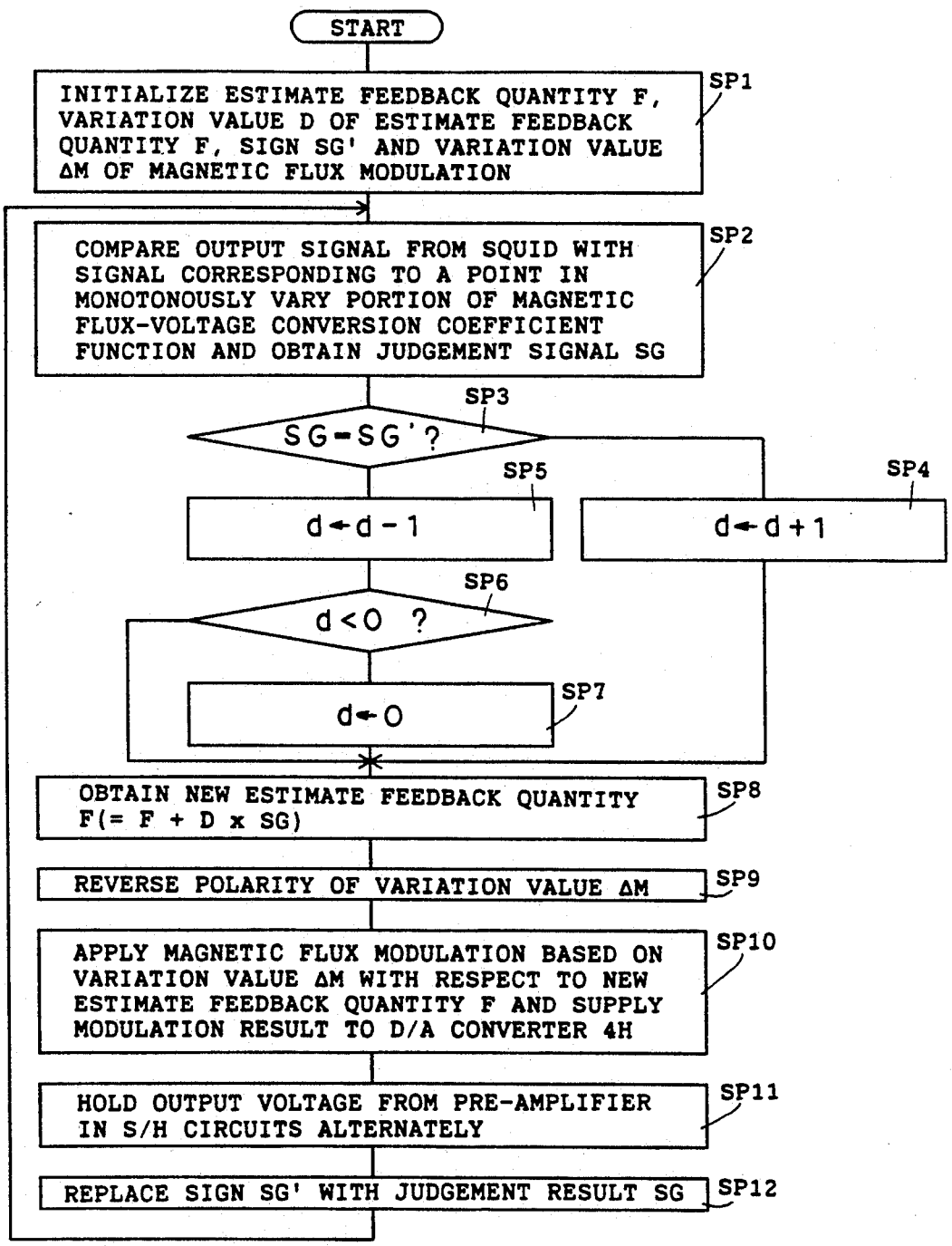
FIG. 8 is a flowchart illustrating another embodiment of a magnetic flux locking method according to the present invention.

FIG. 8 is a flowchart illustrating another embodiment of a magnetic flux looking method according to the present invention.

This magnetic flux locking method differs from the magnetic flux locking method illustrated in FIG. 1 in the following points.

a variation value $\Delta m$ of magnetic flux modulation is further initialized in step SP1, and new steps are further provided after a new estimate feedback quantity $F (=F+d\times SG)$ obtaining step (refer to step SP8 in FIG. 1) and before the replacement step (refer to step SP9 in FIG. 1) of the sign SG' with the judgement result SG. The new steps include a polarity reversing step of the variation value $\Delta m$ of magnetic flux modulation, a step in which magnetic flux modulation based on the variation value $\Delta m$ of magnetic flux modulation is applied with respect to the new estimate feedback quantity F and the magnetic flux modulation result is supplied to the D/A converter $4h$, and a step in which output voltages sequentially output from the pre-amplifier $4c$ are alternately held by any one of the S/H circuits selectively.

Figure 10:
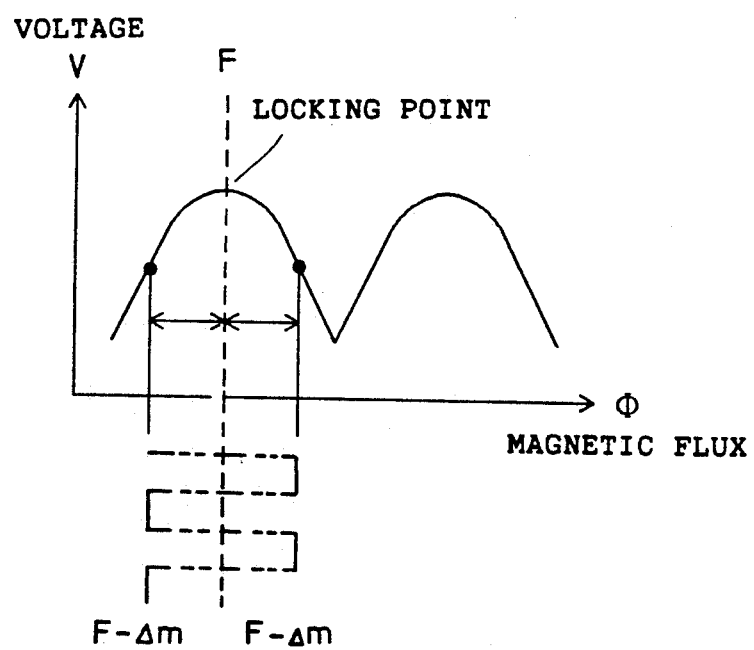
FIG. 10 is a diagram for explaining the relationship between a magnetic flux modulation signal and an output voltage from a SQUID.

When this method is employed, magnetic flux modulation is performed by the variation values $\pm\Delta m$ with respect to the estimate feedback quantity F as is shown in FIG. 10. Output voltages (refer to the two dotts and dash line in FIG. 10) output through the pre-amplifier $4c$ are alternately held by the corresponding S/H circuit. The output voltages held by both S/H circuits $4t1$ and $4t2$ are compared in size to one another so as to obtain a judgement result SG. Thereby, a shifting direction from the point for magnetic flux locking is detected based on the judgement result. Also, a shifting quantity from a point for magnetic flux locking is discriminated as to whether it is great or not, based on the history of the judgement results. The variation value d of the estimate feedback quantity F is incremented so as to improve the followability of the feedback quantity to the external magnetic flux when the shifting quantity is discriminated to be great. On the contrary, the variation value d of the estimate feedback quantity F is decremented so as to improve the accuracy of the feedback quantity to the external magnetic flux. As is apparent from the foregoing, high followability in the magnetic flux locking is compatible with the high accuracy in the magnetic flux locking.

SECOND APPARATUS EMBODIMENT

Figure 11:
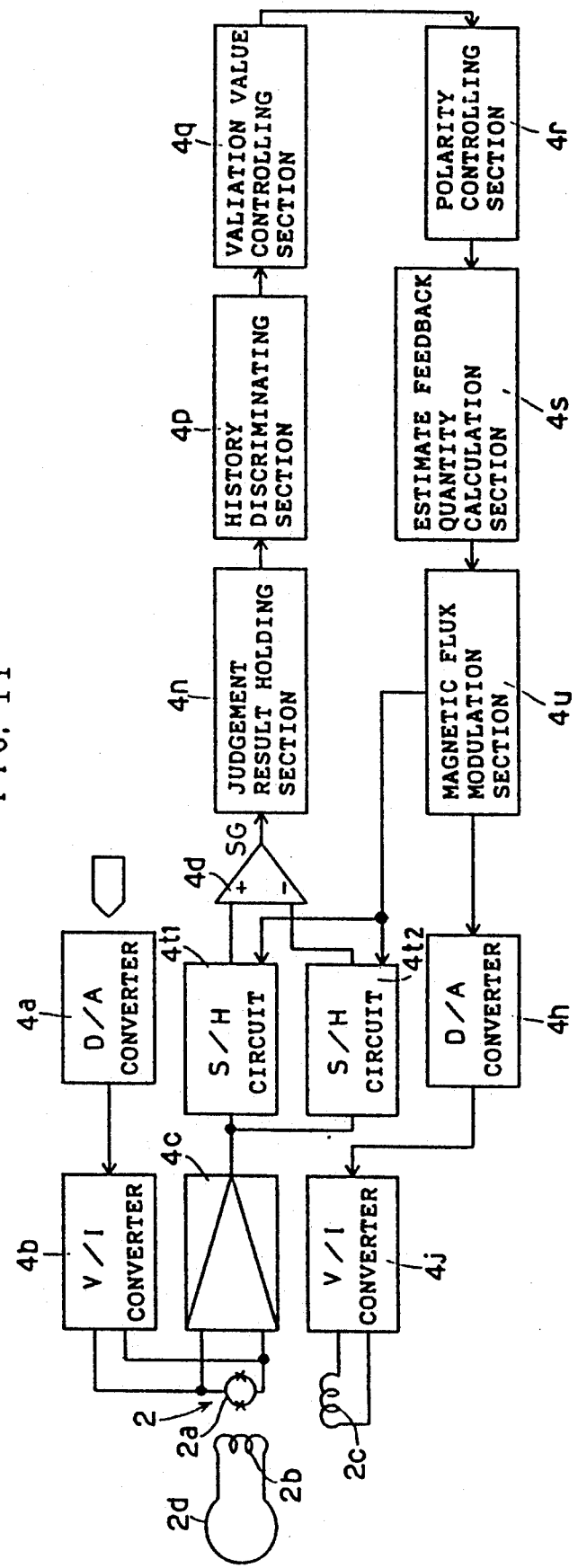
FIG. 11 is an electrical diagram showing another embodiment of a magnetic flux locking apparatus according to the present invention.
Figure 12:
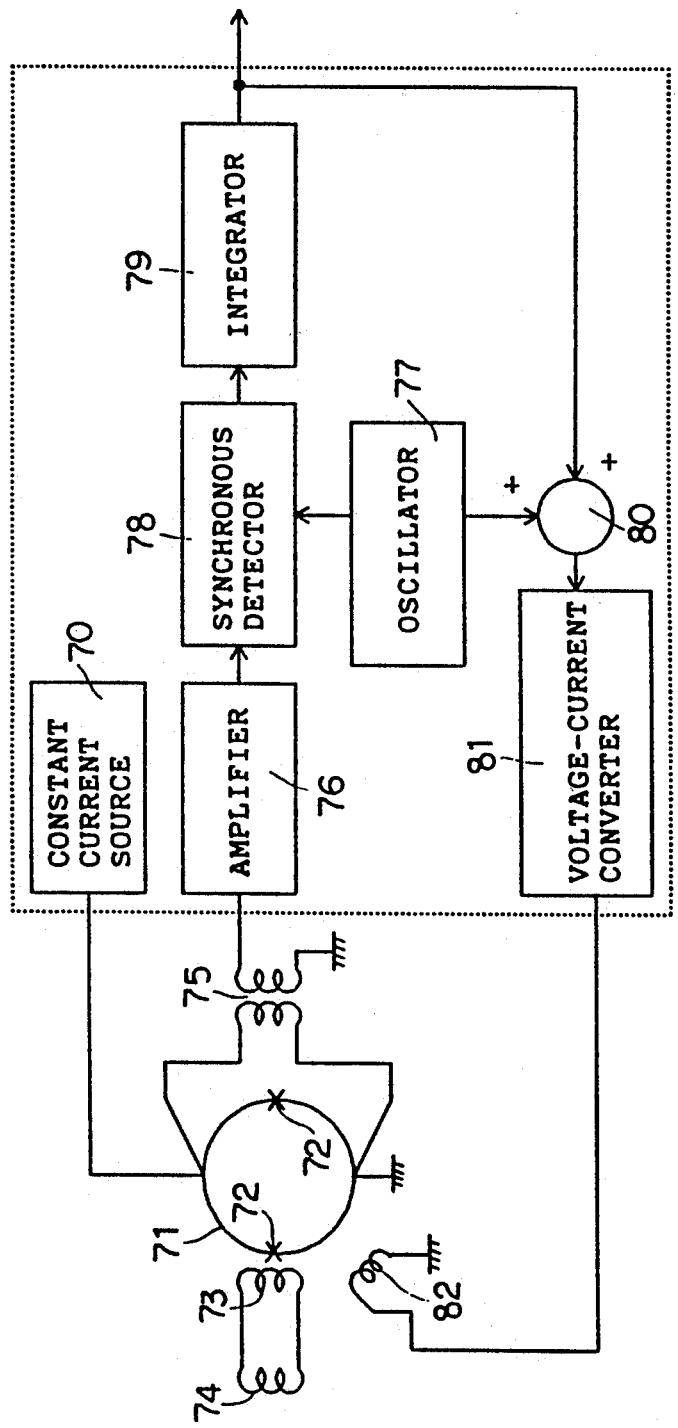
FIG. 12 is an electrical diagram showing a conventional dc-SQUID flux meter.

FIG. 11 is an electrical diagram showing another embodiment of a magnetic flux locking apparatus according to the present invention.

This magnetic flux looking apparatus differs from the magnetic flux locking apparatus shown in FIG. 5 in the following points.

The D/A converter $4e$ is omitted and a pair of S/H circuits $4t1$ and $4t2$ for alternately holding output voltages from the pre-amplifier $4c$, are further provided, output voltages held by corresponding S/H circuits $4t1$ and $4t2$ are supplied to corresponding input terminals of the comparator $4d$, a magnetic flux modulation section $4u$ for adding or reducing a variation value $\Delta m$ of magnetic flux modulation from the new estimate feedback quantity F which is calculated by the estimate feedback quantity calculation section $4s$, is further provided, and the magnetic flux modulation section $4u$ supplies a control signal to both S/H circuits $4t1$ and $4t2$, the control signal instructing S/H circuits to operate selectively in synchronism with the magnetic flux modulation.

When this apparatus is employed, a shifting direction from a point for magnetic flux locking is easily detected by judging the output voltages in size which voltages are held by corresponding S/H circuits $4t1$ and $4t2$, the point is supposed as a peak of the magnetic flux-voltage conversion coefficient function of the SQUID. The shifting quantity is also easily judged as to whether it is large or not based on the history of the judgement results. Therefore, high followability in magnetic flux looking is compatible with high accuracy in the magnetic flux locking by incrementing or decrementing the variation value d of the estimated feedback quantity F, which operation is similar to the second method embodiment. Furthermore, this magnetic flux locking apparatus performs good magnetic flux locking without being influenced by voltage drift even when the magnetic flux-voltage conversion coefficient function includes voltage drift.

The magnetic flux locking methods and apparatus according to the present invention are not limited to the embodiments mentioned above. The first method embodiment and the first apparatus embodiment may be modified to two-channel application so as to perform good magnetic flux locking without being influenced by a voltage drift, both channels are arranged to perform magnetic flux locking in opposite monotonously varying portions of the magnet flux-voltage conversion coefficient function of the SQUID. The magnetic flux locking methods and apparatus may employ plural SQUIDs for multichannel application which SQUIDs are to be operated simultaneously. The initialization operation and determination of the bias current may be automated.

The terms and expressions which have been employed are used as terms of description and not of limitation, and there is no intention, in the use of such terms and expressions, to exclude equivalents of the features shown and described, or portions thereof, it being recognized that various modifications are possible within the scope of the invention as claimed.

What is claimed is:

1. A magnetic flux locking method which maintains a magnetic flux guided to a superconductive loop of a SQUID at a constant magnetic flux by supplying a feedback signal to a feedback coil of said SQUID for compensation for variations in the magnetic flux guided to said superconductive loop by an input coil, said SQUID being housed in a casing which is refrigerated to a temperature below a critical temperature for superconductivity, said method comprising the steps of:
  judging whether or not an output signal output from opposite ends of said superconductive loop of said SQUID is greater than a predetermined signal to obtain a judgement result representative of a shifting of direction of said output signal with respect to said predetermined signal, said SQUID being supplied with a predetermined bias and said predetermined signal corresponding to a point in a monotonously varying portion of a magnetic flux-voltage conversion coefficient function of said SQUID;
  holding a plurality of judgement results obtained from said judging of output signals from said superconductive loop relative to said predetermined signal in a time sequential manner to obtain a history of said judgement results;
  varying a variation value component of said feedback signal based upon said history of said judgement results to obtain a varied variation value component, said step of varying a variation value including the steps of incrementing said variation value as said judgement results continue to be the same, and decrementing said variation value as different judgement results are obtained alternately;
  providing a signal having a value determined based upon a most recent judgement result and said varied variation value component; and
  supplying said signal having said determined value to said feedback coil of said SQUID as said feedback signal.

2. A magnetic flux locking apparatus which maintains a magnetic flux guided to a superconductive loop of a SQUID at a constant magnetic flux by supplying a feedback signal to a feedback coil of said SQUID for compensation for variations in the magnetic flux guided to said superconductive loop by an input coil, said SQUID being housed in a casing which is refrigerated to a temperature below a critical temperature for superconductivity, said apparatus comprising:
  judging means for judging whether or not an output signal output from opposite ends of said superconductive loop of said SQUID is greater than a predetermined signal to obtain a judgement result representative of a shifting of direction of said output signal with respect to said predetermined signal, said SQUID being supplied with a predetermined bias and said predetermined signal corresponding to a point in a monotonously varying portion of a magnetic flux-voltage conversion coefficient function of said SQUID;
  holding means for holding a plurality of judgement results from said judging means in a time sequential manner to obtain a history of said judgement results;
  variation value controlling means for varying a variation value component of said feedback signal based upon said history of judgement results to obtain a varied variation value component, said variation value controlling means incrementing said variation value component as said judgement results continue to be the same, and decrementing said variation value component when different judgement results are obtained alternately; and
  polarity controlling means for controlling the polarity of said variation value component of said feedback signal based on said judgement result.

3. A magnetic flux locking method which maintains a magnetic flux guided to a superconductive loop of a SQUID at a constant magnetic flux by supplying a feedback signal, which is obtained by applying magnetic flux modulation to an estimate feedback quantity, to a feedback coil of said SQUID for compensation for variations in the magnetic flux guided to said superconductive loop by an input coil, said SQUID being housed in a casing which is refrigerated to a temperature below a critical temperature for superconductivity, said method comprising the steps of:
  collecting output signals in synchronism with said magnetic flux modulation, said output signals being output from opposite ends of said superconductive loop of said SQUID to which is supplied a predetermined bias;
  alternately holding said output signals;
  judging the relationship in magnitude of said alternately held output signals to obtain a judgement result;
  holding judgement results obtained in said step of judging the relationship in magnitudes in a time sequential manner to obtain a history of said judgement results;
  varying a variation value component of said estimate feedback quantity based upon said history of judgement results, said step of varying a variation value including the steps of incrementing said variation value as said judgement results continue to be the same, and decrementing said variation value as different judgement results are obtained alternately; and
  supplying said feedback signal to said feedback coil of said SQUID, said feedback signal having a value determined by varying said estimate feedback quantity based on a most recent judgement result.

4. A magnetic flux locking apparatus which maintains a magnetic flux guided to a superconductive loop of a SQUID at a constant magnetic flux by supplying a feedback signal, which is obtained by applying magnetic flux modulation to an estimate feedback quantity, to a feedback coil of said SQUID for compensation variations in the magnetic flux guided to said superconductive loop by an input coil, said SQUID being housed in a casing which is refrigerated to a temperature below a critical temperature of superconductivity, said apparatus comprising:
  collection means for collecting output signals in synchronism with said magnetic flux modulation, said output signals being output from opposite ends of said superconductive loop of said SQUID to which is supplied a predetermined bias;
  a pair of signal holding means for alternately holding said output signals;
  judging means for judging the relationship in magnitude of said output signals held by said signal holding means to obtain a judgement result;
  judgement result holding means for holding judgement results obtained by said judging means in a time sequential manner to obtain a history of judgement results;
  variation value controlling means for varying a variation value of said estimate feedback quantity based upon said history of judgement results, said variation value controlling means incrementing said variation value component as said judgement results continue to be the same, and decrementing said variation value component when different judgement results are obtained alternately; and polarity controlling means for controlling the polarity of said variation value component of said estimate feedback quantity based on said judgement result.

* * * * *